March 20, 1962 S. MARKOWITZ 3,025,591

WIRE-FASTENING METHOD

Filed Dec. 15, 1958

SEYMOUR MARKOWITZ
INVENTOR.

BY Lyon & Lyon
ATTORNEYS

United States Patent Office 3,025,591

Patented Mar. 20, 1962

3,025,591

WIRE-FASTENING METHOD

Seymour Markowitz, Los Angeles, Calif., assignor, by mesne assignments, to Ampex Corporation, Redwood City, Calif., a corporation of California Filed Dec. 15, 1958, Ser. No. 780,302

3 Claims. (Cl. 29—155.55)

This invention relates to a method and means for fastening a wire to a printed circuit and, more particularly, to improvements therein.

The soldering of thin wire to a printed circuit board is a difficult and somewhat unreliable process. The usual method is to insert the strip end of the wire to be soldered through a small hole in the printed-circuit board from the component side. Then a right-angle bend is made at the end of the wire. Then a small length of bare wire is pulled into contact with the printed circuit in the vicinity of the hole when tension is applied to the wire from the component side. Where many magnet wires must be dip-soldered together, tension has to be applied to every wire during the dipping period. Even when this operation is performed successfully, there is very little actual contact area between the wires and the printed circuitry.

An object of this invention is to provide a simple method and means for enabling the connection of wires to printed circuits.

Another object of this invention is the provision of a method and means of effectuating connection of wires to printed circuits with ample contact therein between wires and printed circuitry.

Still another object of the present invention is the provision of a novel, useful method and means for connecting thin wires to printed circuits.

These and other objects of the invention are achieved by providing an eyelet comprising a small, hollow cylinder, preferably made of brass, which is flanged at one end. The unflanged end is slitted longitudinally to about the center. The unflanged end is inserted into a hole in the printed circuit board from the component side and swaged. The eyelet is thereby held tightly in the board and is ready to be wound with a thin magnet wire. The shape of the swaged end is preferably a cone. The thin magnet wire is inserted through the hole of the eyelet from the component side. The free end of the wire on the printed-circuit side is then pulled through the slit and wound around the outside of the conical wall several times, after which the excess wire may be broken off. The wire is thereby held securely for dip soldering and is in contact with the printed circuit on the board.

The novel features that are considered characteristic of this invention are set forth with particularity in the appended claims. The invention itself, both as to its organization and method of operation, as well as additional objects and advantages thereof, will best be understood from the following description when read in connection with the accompanying drawings, in which:

Figures 1, 2:
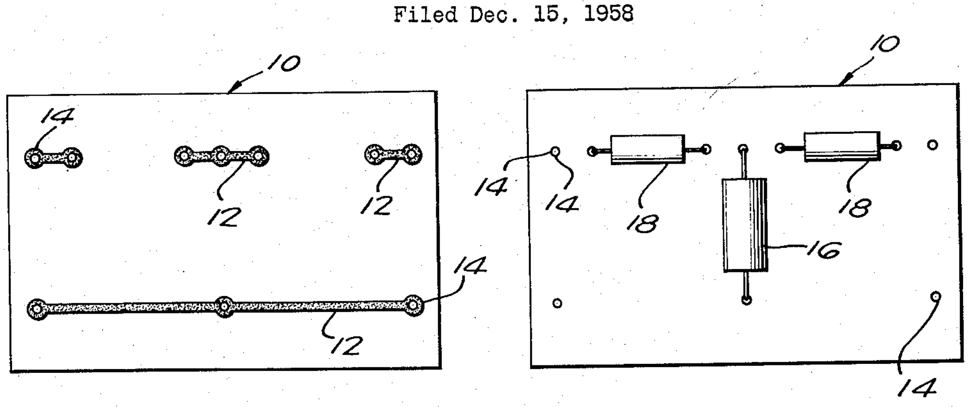
FIGURE 1 is a plan view of a simple printed-circuit board showing printed-circuit wiring.
FIGURE 2 is a plan view of the opposite, or component, side of the printed-circuit board shown in FIGURE 1.

Referring now to FIGURE 1, by way of illustration there is shown a very simple printed-circuit board. This will include, usually, a board of phenolic material 10 or some other insulating material on which there is laid down a pattern of conductive material 12, such as silver or copper. The making of the printed-circuit board is well known and need not be gone into at this point, since it forms no part of this invention. The conductive pattern, or conductors 12, connect between holes 14 in the printed-circuit board. As shown in FIGURE 2, these holes extend through the board and serve the purpose of enabling the connection to the conductors of components such as the resistors 16 and capacitors 18. The leads of these components are extended through the holes and are maintained in contact with the printed-circuit wiring on the opposite side of the board shown in FIGURE 1, while the dip-soldering process is performed.

With the rather rigid, or stiff, leads of components, the problem of maintaining the components in place and in contact with the printed-circuit wiring during a dip-soldering process is not a difficult one. However, when connection is sought to be made using thin magnet wire having sizes on the order of number 30 and thinner, then there is difficulty in maintaining the wire in contact during the dip-soldering process, and, further, there is difficulty in obtaining a sufficient contact area between this wire and the printed-circuit conductors. Such wiring would be inserted to connect the printed-circuit board to other components, such, for example, as a magnetic-core memory reading winding and/or driving windings. The openings on the extreme ends of the printed-circuit conductors here could serve as the input and output connecting openings, respectively for the simple filter composed of the two condensers and resistor shown in the drawing.

Figure 3A:
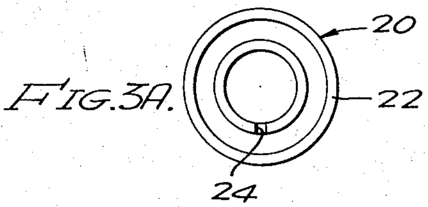
FIGURE 3A is a plan view before swaging of the embodiment of the invention.
Figure 3B:
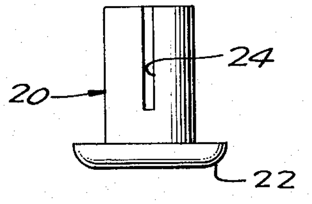
FIGURE 3B is a view in elevation and before swaging of the embodiment of the invention.
Figure 4:
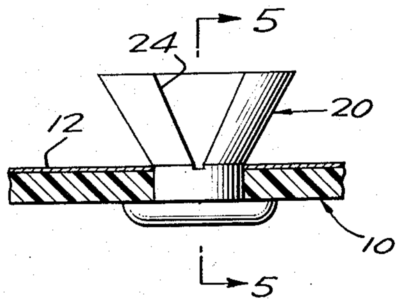
FIGURE 4 is a view of the embodiment of the invention in position and after swaging on a printed-circuit board.

In accordance with this invention, there is shown in the plan view in FIGURE 3A and the side view in FIGURE 3B a substantially cylindrical eyelet 20, having one end 22 flanged. The unflanged portion of the eyelet is slitted, as indicated by the reference numeral 24, to about the center of the eyelet. As shown in FIGURE 4, the cylindrical eyelet is inserted into a printed-circuit board from the component side and then is swaged so that the slit portion of the eyelet assumes the somewhat conical shape, as shown in FIGURE 4.

Figure 5:
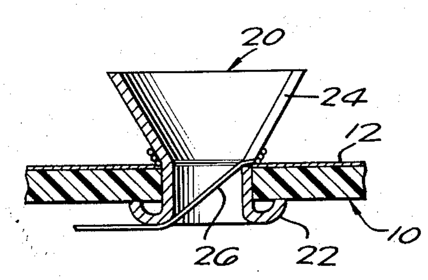
FIGURE 5 shows how wire may be wound for dip-soldering using the embodiment of the invention.

To secure a magnet wire to the eyelet for dip-soldering, the operation as shown in FIGURE 5 may be performed. The bare wire 26 is inserted into the eyelet from the component side of the printed-circuit board. The end is then pulled through the slit and wound around the outside of the conical walls several times as close down to the printed-circuit board as can be obtained. After this, the excess end of the wire may be broken off. The wire is thus held securely for dip soldering. Upon dipping, solder adheres readily to the eyelet due to its large area and fills a space between the conical wall of the eyelet and the printed-circuit board. Thus, a reliable solder joint is made, connecting magnet wire, eyelet, and printed circuitry.

There has accordingly been described and shown hereinabove a novel and useful method and means for fastening thin wire to printed circuits. By this arrangement, the operation can be performed rapidly, simply, and positively, insuring sufficient contacts for electrical purposes.

I claim:

1. A method for connecting a wire to a printed-circuit conductor on a printed-circuit board through a hole in the board to which said conductor extends using an eyelet comprising a conductive metal slitted cylinder having a flange on one end comprising inserting said eyelet into said hole with its flanged end on the side of said printed-circuit board opposite to that on which said conductor is mounted, backing said eyelet from its flanged side, swaging said eyelet slitted side to spread it until it has a substantially conical shape, passing one end of said wire through said eyelet and slit from the flanged side, winding said one end of said wire around said swaged portion of said eyelet, and dip soldering said printed-circuit board.

2. A method for connecting a wire to a printed-circuit conductor on a printed-circuit board through a hole in the board to which said conductor extends using an eyelet comprising a conductive metal cylinder having a flange on one end and a slit cut in its cylindrical wall, said slit extending from the end of said eyelet opposite said flanged end partway toward said flanged end, said method comprising inserting said eyelet into said hole with its flanged end on the side of said printed-circuit board opposite to that on which said conductor is mounted, spreading the portion of said eyelet which extends from said board until it has a substantially conical shape, passing one end of said wire through said eyelet and slit from the flanged side, winding said one end of said wire around said conical-shaped portion of said eyelet, and dip soldering said printed-circuit board.

3. A method for connecting a wire to a printed circuit conductor on a printed-circuit board through a hole in the board to which said conductor extends using an eyelet comprising a conductive metal cylinder having a flange on one end and a slit cut in its cylindrical wall, said slit extending from the end of said eyelet opposite said flanged end partway toward said flanged end, said method comprising inserting said eyelet into said hole with its flanged end on the side of said printed-circuit board opposite to that on which said conductor is mounted, backing said eyelet on its flanged side, swaging said eyelet on its slitted side to spread it until it has a substantially conical shape, passing one end of said wire through said eyelet and slit from the flanged side, winding said one end of said wire around said conical-shaped portion of said eyelet, and dip soldering said printed-circuit board.

References Cited in the file of this patent

UNITED STATES PATENTS

| | | |
|---|---|---|
| 2,316,555 | Bugg | Apr. 13, 1943 |
| 2,420,754 | MacFadden | May 20, 1947 |
| 2,464,405 | Knauf | Mar. 15, 1949 |
| 2,533,483 | Losquadro | Dec. 12, 1950 |
| 2,718,625 | Harrison | Sept. 20, 1955 |
| 2,779,998 | Bailey | Feb. 5, 1957 |
| 2,846,659 | Hinspater et al. | Aug. 5, 1958 |
| 2,865,093 | Ingram | Dec. 23, 1958 |
| 2,902,629 | Little et al. | Sept. 1, 1959 |

FOREIGN PATENTS

| | | |
|---|---|---|
| 495,460 | Germany | Apr. 7, 1930 |